United States Patent [19]

Block

[11] 4,354,770

[45] Oct. 19, 1982

[54] WEDGE ASSEMBLY

[75] Inventor: Sheldon A. Block, Cupertino, Calif.

[73] Assignee: The United States of America as represented by the Secretary of the Navy, Washington, D.C.

[21] Appl. No.: 151,072

[22] Filed: May 19, 1980

[51] Int. Cl.³ ............................................. F16B 2/14
[52] U.S. Cl. ................................. 403/409; 254/104; 361/415
[58] Field of Search ............... 361/386, 415; 269/234; 254/104, 42; 403/409

[56] References Cited

U.S. PATENT DOCUMENTS

| 1,217,539 | 2/1917 | Underwood | 254/42 |
| 2,735,650 | 2/1956 | Lee et al. | 254/42 |
| 3,418,534 | 12/1968 | Koons et al. | 361/415 |
| 3,678,342 | 7/1972 | Shaw | 361/386 |
| 3,735,206 | 5/1973 | Pesek | 361/386 |
| 4,089,043 | 5/1978 | Fraboni et al. | 361/415 |
| 4,157,583 | 6/1979 | Basmajian et al. | 361/388 |
| 4,189,219 | 4/1979 | Kraft | 361/386 |

Primary Examiner—A. T. Grimley
Assistant Examiner—D. A. Tone
Attorney, Agent, or Firm—R. S. Sciascia; Charles D. B. Curry

[57] ABSTRACT

A wedge assembly for securing a circuit board in an electronic package gives positive surface contact and excellent heat transfer between the multi-layer board and the electronic package as well as positive lock under vibration and shock. A housing, which may be mounted on a multi-layer board, contains a wedge member having two ramped ends within an open cavity having a single ramped end. Means such as a ramped anvil which slides within the cavity under force from a screw is provided within the cavity for adjusting the wedge member relative to the housing to provide positive contact between the electronic package and the multi-layer board.

4 Claims, 4 Drawing Figures

U.S. Patent Oct. 19, 1982 4,354,770
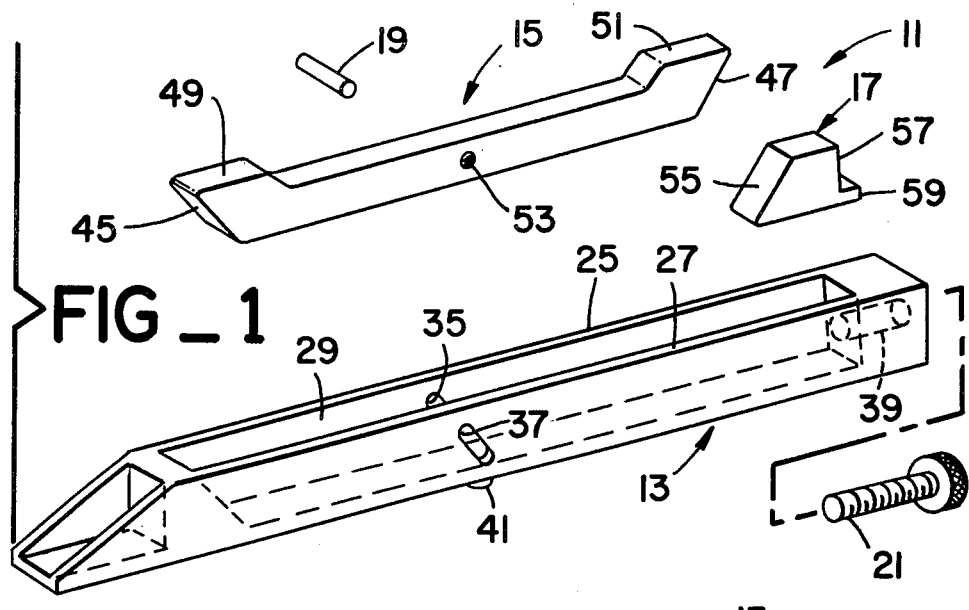
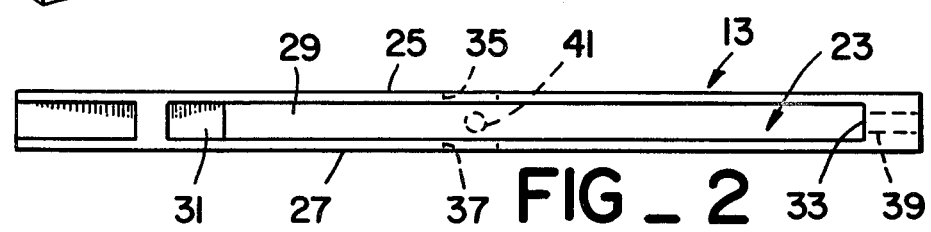
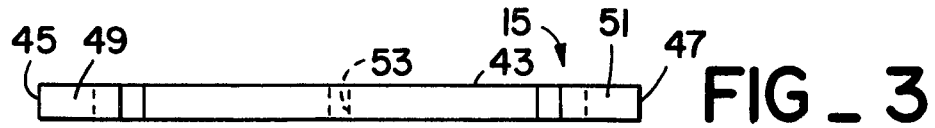
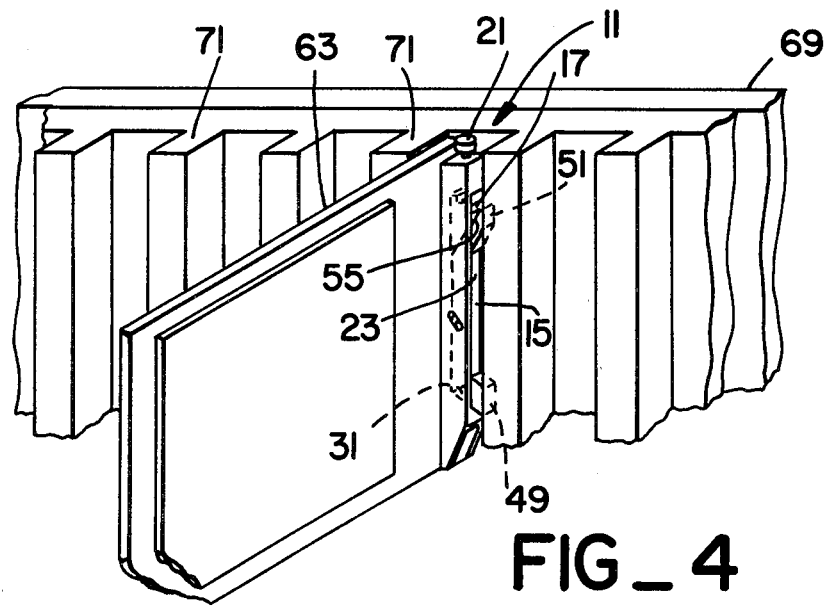

WEDGE ASSEMBLY

BACKGROUND OF THE INVENTION

1. Field of the Invention

The present invention relates to methods for securing circuit boards within an electronic package, and more particularly to a wedge assembly to secure a multi-layer board assembly to an electronic package which gives positive surface contact with the electronic package as well as excellent heat transfer and positive lock under vibration and shock.

2. Description of Prior Art

Previous methods for securing circuit boards in electronic packages have used springs, clamps and solid mounting. However, these methods are susceptible to vibration and shock, do not provide good thermal contact, and are sometimes unwieldy when replacement of the circuit boards is desired.

Another method uses the wedge concept by either using wedge shaped protected covers for the circuit boards and wedging the circuit board assemblies against each other in a confined space, such as in U.S. Pat. No. 3,735,206 by Clarence T. Pesek entitled "Circuit Board Package with Wedge Shaped Covers", or by using wedges in the card guides to contact with special bars on the edges of the circuit board, such as in U.S. Pat. No. 3,678,342 by Jeffrey I. Shaw entitled "Mounting Arrangement for a Board Which Supports Electrical Conductors", or by having wedge members which slide along the inclined edge of a support member to mate with a fixed wedge member supporting a circuit board, such as in U.S. Pat. No. 3,418,534 by John P. Koons et al entitled "Latching Devices". These wedge techniques require special circuit board or circuit board holder designs, and thus are relatively complex.

SUMMARY OF THE INVENTION

Accordingly the present invention provides a wedge assembly for securing a circuit board in an electronic package which gives positive surface contact and excellent heat transfer between the multi-layer board and the electronic package as well as positive lock under vibration and shock. A housing, which may be mounted on a multi-layer board, contains a wedge member having two ramped ends within an open cavity having a single ramped end. Means, such as a ramped anvil which slides within the cavity under force from a screw, is provided within the cavity for adjusting the wedge member relative to the housing to provide positive contact between the electronic package and the multi-layer board.

Therefore, it is an object of the present invention to provide means for securing a multi-layer board within an electronics package with positive contact and excellent thermal transfer which has positive lock under vibration and shock.

Another object of the present invention is to provide a relatively simple method for securing a multi-layer board in an electronics package to reduce cost.

Other objects, advantages and novel features of the present invention will be apparent from the following detailed description when read in conjunction with the appended claims and attached drawing.

BRIEF DESCRIPTION OF THE DRAWING

FIG. 1 is an exploded perspective view of a wedge assembly.

FIG. 2 is a top plan view of the housing for the wedge assembly.

FIG. 3 is a top plan view of the wedge member for the wedge assembly.

FIG. 4 is a perspective view of a multi-layer board mounted in an electronic package and secured by the wedge assembly.

DESCRIPTION OF THE PREFERRED EMBODIMENT

Referring now to FIGS. 1 through 3, a wedge assembly 11 is shown having a housing 13, a wedge member 15, an anvil 17, a guide pin 19 and a screw 21. The housing 13 has an open cavity 23 formed by sidewalls 25 and 27, bottom 29, ramped forward end 31 and blunt rear end 33. Parallel, aligned oblique ellipsoidal openings 35 and 37 extend through the sidewalls 25 and 27, respectively, the obliquity being parallel to the ramped forward end 31, and a threaded hole 39 extends through the blunt rear end 33 parallel with the bottom 29. Exterior to the bottom 29 is an integral pin 41.

The wedge member 15 has a body 43 with a first and a second ramped end 45 and 47, respectively. The ramped ends 45 and 47 extend above the body 43 to form contact lands 49 and 51, respectively. A pin hole 53 extends through the body 43 orthogonal to the longitudinal axis of the wedge member 15. When the wedge member 15 is inserted in the open cavity 23, the guide pin 19 is inserted through the ellipsoidal holes 35 and 37 and the pin hole 53 to secure the wedge member in the open cavity. The guide pin 19 also serves to guide the wedge member 15 upward from the bottom 29 when the wedge member is moved forward in the open cavity 23. The slope of the ramped forward end 31 of the housing 13 is matched by the slope of the first ramped end 45 of the wedge member 15.

The anvil 17 has a ramped forward face 55 with a slope which matches the slope of the second ramped end 47 of the wedge member 15. A blunt rear end 57 has a flange 59 at the bottom such that when the anvil 17 is placed in the open cavity 23 to the rear of the wedge member 15, and when the screw 21 is threaded through the threaded hole 39 to protrude into the open cavity, the anvil is retained in the open cavity.

In operation as shown in FIG. 4 the wedge assembly 11 is mounted on a multi-layer board 61 by any suitable means with the integral pin 41 fitting into a corresponding location hole on the multi-layer board to provide good thermal contact with the heat sink side 63 of the multi-layer board. The electronics package casting 69 has a casting heat sink 71. When the multi-layer board 61 is mated in the electronics package, the wedge assembly 11 is situated between the multi-layer board and the casting heat sink 71. Tightening of the screw 21 forces the anvil 17 forward within the open cavity 23 against the wedge member 15. Under the force of the anvil 17 the wedge member 15 rises along the forward ramped end 31 of the open cavity 23 and the ramped face 55 of the anvil until the contact lands 49 and 51 make positive contact with the casting heat sink 71.

Thus, the present invention provides a wedge assembly which gives an excellent thermal path between the multi-layer board and the electronics package with positive contact which is not susceptible to shock and vibration.

What is claimed is:

1. Apparatus for securing a circuit board in a rectangular channel comprising:

(a) a housing suitable for mounting on the surface of said circuit board and having an open cavity, said cavity being defined by a flat bottom surface, parallel sidewalls which are orthogonal to said flat bottom surface, a first end surface between said sidewalls extending upward in a forward ramp from said bottom surface, and a second end surface between said sidewalls and substantially normal to said bottom surface, said sidewalls having aligned, ellipsoidal openings extending therethrough having the same slope as said first end surface;

(b) a single wedge member configured to be disposed in said open cavity, a first end of said wedge member having a ramped surface having a slope complementary to the slope of said first end surface of said cavity and a second end of said wedge member having a ramped surface having a slope of the same inclination but opposite in direction to the slope of the first end of said wedge member, the bottom surface of said wedge member being flat and the top surface having at least two contact lands, said wedge member having a hole therethrough orthogonal to the longitudinal axis of said wedge member;

(c) a guide pin which extends through said hole in said wedge member into said ellipsoidal openings of said housing for retaining said wedge member in said cavity;

(d) an anvil configured to be disposed in said cavity between said wedge member and said second end surface of said cavity, said anvil having a ramped surface complementary to the ramped surface of the second end of said wedge member at a first end, a flat bottom surface, and a surface substantially normal to said bottom surface at a second end, said anvil disposed in said cavity so that its ramped surface faces said wedge member; and (e) means for exerting force upon said second end of said anvil such that said anvil moves forward in said cavity against said wedge member, the wedge member being moved upward between the first end surface of said housing and the ramped surface of said anvil so that the contact lands of the wedge member press against one wall of the channel and the opposite surface of the housing presses against the circuit board to secure it against the other wall of the channel.

2. Apparatus as recited in claim 1 wherein said means for exerting force comprises a screw threadedly engaging a hole through the second end surface of said housing, said screw extending into said open cavity and contacting the second end of said anvil.

3. Apparatus as recited in claim 2 wherein said anvil includes a flange extending toward the second end surface of said cavity from the bottom of the second end of said anvil such that when said anvil is situated within said open cavity said flange is between the screw and the bottom surface of said housing and the first end of said anvil is under the second ramped end of said wedge member.

4. Apparatus as recited in claim 3 wherein said housing further includes means integral with said bottom surface and exterior to said cavity for locating said apparatus on said circuit board.

* * * * *